(12) United States Patent
Richardson et al.

(10) Patent No.: US 6,228,732 B1
(45) Date of Patent: May 8, 2001

(54) TUNNEL NITRIDE FOR IMPROVED POLYSILICON EMITTER

(75) Inventors: William F. Richardson; Anhkim Duong, both of San Antonio, TX (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 09/470,388

(22) Filed: Dec. 22, 1999

(51) Int. Cl.$^7$ .................................................. H01L 21/331
(52) U.S. Cl. .............................................................. 438/342
(58) Field of Search ................................... 438/342, 338, 438/758, 762, 765, 769, 775, 788, 791, 792

(56) References Cited

U.S. PATENT DOCUMENTS

| | | | |
|---|---|---|---|
| 4,755,487 | 7/1988 | Scovell et al. | 437/247 |
| 5,585,292 | 12/1996 | Morita et al. | 437/407 |
| 6,060,403 | * 5/2000 | Yasuda et al. | 438/765 |

OTHER PUBLICATIONS

Takahi Ito, Tetsuo Nakamura, & Hajime Ishikawa, *Advantages of Thermal Nitride and Nitroxide Gate Films in VLSI Process*, IEEE Transactions On Electron Devices, vol. ED–29, No. 4, Apr. 1982, pp. 498–502.

William F. Richardson, *The Fabrication and Evaluation of a Silicon Photovoltaic Cell with a Directly Nitrided Tunnel Insulator*, A Dissertation Presented to the Faculty of the Graduate School University of Missouri–Columbia, May 1981.

M. Hirayama, T. Matsukawa, H. Arima, Y. Ohno, & H, Nakata, Growth Mechanism of Silicon Plasma Anode Nitridation, J. Electrochemical Soc.: Solid–State Science and Technology, vol. 132, No. 10, Oct. 1985, pp. 2494–97.

\* cited by examiner

*Primary Examiner*—David Nelms
*Assistant Examiner*—Quoc Hoang
(74) *Attorney, Agent, or Firm*—Wood, Herron & Evans, L.L.P.

(57) ABSTRACT

A method is disclosed for reproducibly and controllably enhancing the current gain of a bipolar junction transistor. Prior to depositing an extrinsic emitter region of polycrystalline silicon, the surface of a monocrystalline silicon substrate is nitridized to grow a layer of silicon nitride thereon. The interfacial layer of silicon nitride functions as a tunnel insulator to enhance the current gain of the transistor and as a diffusion barrier to prevent thickening of the tunnel insulator due to the growth of a native oxide layer while exposed to an oxygen-containing atmosphere. The ubiquitous native silicon oxide on the surface of the monocrystalline silicon substrate may be optionally removed either before nitridation or after nitridation.

21 Claims, 2 Drawing Sheets

TUNNEL NITRIDE FOR IMPROVED POLYSILICON EMITTER

FIELD OF THE INVENTION

The present invention relates to integrated circuits and, in particular, to a method for improving the current gain and stability of a vertical bipolar transistor structure by depositing a nitrided layer as a tunnel insulator between the transistor's monocrystalline silicon base and polycrystalline silicon emitter.

BACKGROUND OF THE INVENTION

Vertical bipolar junction transistors are widely used by the semiconductor industry as devices in integrated circuit architectures. As is well-known in the semiconductor industry, the electrical characteristics of such transistors are influenced strongly by a layer of an interfacial tunnel insulator interposed between a base region formed in a monocrystalline silicon substrate and an extrinsic emitter region of polycrystalline silicon (polysilicon) deposited thereon. Because the interfacial tunnel insulator limits reverse injection of majority carriers across the reverse biased base-emitter junction, the base current of the transistor will be minimized. The reduction in the operative base current concomitantly increases the current gain of the transistor.

The presence of a tunnel insulator can increase the current gain by a factor of about two to three. However, current gain will be maximized only by an optimal thickness of tunnel insulator. If the tunnel insulator is overly-thick, the tunneling of minority carriers is limited. As a result, the effective resistance of the emitter-base junction exceeds a desirable value. If the tunnel insulator is overly-thin, the reverse injection of majority carriers is not reduced from the base region to the emitter region. As a result, any potential benefit from the presence of the tunnel insulator is unrealized.

Conventional fabrication techniques for vertical bipolar junction transistors rely upon an interfacial layer of oxide ($SiO_2$) as the tunnel insulator. Typically, the layer of oxide is composed of a native oxide. Native oxide grows naturally and spontaneously upon an unpassivated surface of a silicon substrate while that surface is exposed to the ambient oxygen content of the atmosphere. Typically, the layer of native oxide attains a thickness of between about 1 nm and about 5 nm.

A major disadvantage of relying upon native oxide as the tunnel insulator is that its nominal thickness is difficult to controllably reproduce.

Although the ultimate thickness is diffusion-limited, the nominal thickness of native oxide increases with lengthening exposure to the oxygen-laden atmosphere. Due to variable, indefinite time delays between processing steps, the thickness of the native oxide can widely vary for a single batch of silicon substrates or between successive batches. Therefore, batch fabrication may yield transistors having a wide range of current gains.

Device designs are engineered to accommodate the variation since elimination of the interfacial tunnel oxide drastically reduces the current gain of the transistor. However, the prior art has neither disclosed nor taught a method for controlling the thickness of the tunnel insulator. Simplistically, the thickness may be controlled by tightly managing the interval between successive fabrication steps and using automated mechanical loaders. In a manufacturing environment, however, mere temporal control is considered an impractical and inefficient solution.

Thus, what is ideally desired is a reproducible and predictable method of providing a tunnel insulator to enhance the current gain of a vertical bipolar junction transistor having a polysilicon emitter.

SUMMARY OF THE INVENTION

The present invention addresses these and other problems associated with the prior art by defining a method of enhancing the electrical characteristics of a vertical bipolar junction transistor. Further, the present invention provides a method of controllably forming a reproducible thickness of a tunnel insulator on the monocrystalline silicon substrate above the transistor's base region before the superjacent of the polysilicon emitter. Thus, the present invention has an advantage of substantially increasing the predictability of transistor characteristics. The present invention has yet a further advantage that device designs no longer have to be tailored to accommodate the variations in native oxide thickness and concomitant variations in current gain and emitter resistance.

According to the principles of the present invention and according to the described embodiments, the present invention is directed to a method of fabricating a vertical bipolar junction transistor that incorporates a thin layer of silicon nitride as the tunnel insulator. A method having features of the present invention comprises forming an interfacial layer by nitridation of the surface of the monocrystalline silicon substrate before depositing the transistor's polysilicon extrinsic emitter.

In one embodiment of the invention, the tunnel insulator of silicon nitride is formed by plasma-assisted thermal nitridation. Monocrystalline silicon substrates are exposed to a nitrogenous plasma generated in a reaction chamber from a partial pressure of a nitrogen-containing source gas, such as nitrogen, ammonia, a mixture of ammonia and nitrogen, or a mixture of nitrogen and hydrogen. Since the growth kinetics for a given reaction chamber can be empirically predicted, a predetermined thickness of silicon nitride can be reproducibly grown on the silicon substrate. In one aspect of the present invention, the ubiquitous layer of native oxide is removed before plasma-assisted thermal nitridation using an in-situ hydrogen plasma.

In one aspect of the first embodiment of the invention, plasma-assisted thermal nitridation is performed without first removing the native oxide layer. Nitrogen diffuses through the native oxide layer to form a thin layer of silicon nitride on the surface of the monocrystalline silicon substrate. Any residual oxide can be removed following plasma-assisted thermal nitridation using an etchant containing a given concentration of diluted hydrofluoric acid. Alternatively, the mixed oxide/nitride layer can be left intact since such composite films are known to have properties desirable in a tunnel insulator.

In a second embodiment of the invention, the tunnel insulator of silicon nitride can be formed by thermal nitridation, as for example, in a furnace evacuated and backfilled with a nitrogen-rich gas. Alternatively, rapid thermal processing, as is well known in the art, provides a short-time, high-temperature method of thermal nitridation capable of forming a layer of silicon nitride without the attendant problems of dopant diffusion.

Since the growth kinetics of silicon nitride are predictable, the thickness of the tunnel insulator can be discretely engineered to achieve a particular current gain for a given transistor design. Following formation, the layer of silicon nitride acts as a diffusion barrier to prevent further oxidation of the monocrystalline silicon substrate and thickening of the layer of tunnel insulator. Because of the tightened control and stability, transistor characteristics are more uniform and reproducible during the batch processing of a plurality of monocrystalline substrates in a device fabrication line.

These and other objectives, advantages, features, and embodiments will be apparent with reference to the following drawings and detailed written description.

DETAILED DESCRIPTION OF THE INVENTION

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
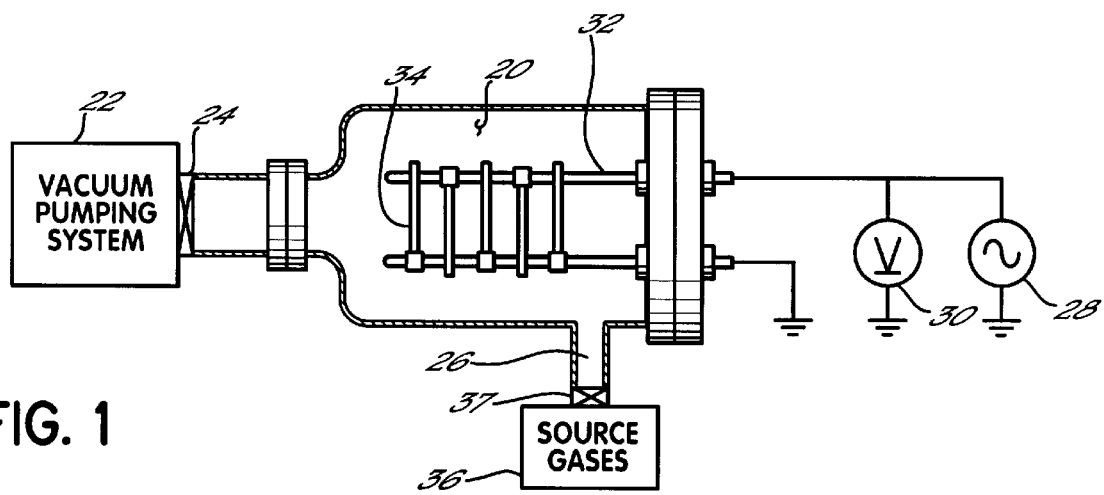
FIG. 1 is a schematic view of a reaction chamber used to perform the plasma-assisted thermal nitridation methods of the present invention.

Referring to FIG. 1, a plasma-assisted thermal nitridation apparatus for accomplishing the methods of the present invention includes a reaction chamber 20, a vacuum pumping system 22, a vacuum isolation valve 24, a gas inlet 26, an excitation power source 28, a direct current power supply 30, and a substrate support structure 32. One or more silicon substrates 34 are received by the substrate support structure 32 within the reaction chamber 20. The reaction chamber 20 is attached to the vacuum pumping system 22 for fluid communication. When the vacuum valve 24 is opened, the vacuum pumping system 22 evacuates the interior of the reaction chamber 20.

When actuated to a closed position, the vacuum valve 24 isolates the vacuum pumping system 22 from fluid communication with the reaction chamber 20. One or more nitrogen-containing gas sources 36 are attached to a gas manifold (not shown) that communicates with the reaction chamber 20 through the gas inlet 26. Gas flow through the gas inlet 26 is metered by a gas inlet valve 37. Preferred nitrogen-containing gases for plasma-assisted thermal nitridation include nitrogen ($N_2$), ammonia ($NH_3$), a mixture of nitrogen and ammonia, and a mixture of nitrogen and hydrogen ($N_2/H_2$). Additional gases, such as pure hydrogen ($H_2$), may also be attached to the gas manifold.

Excitation power source 28 is adapted to generate a nitridation plasma, when energized, by exciting the gas molecules within the reaction chamber 20. Preferably, most gas molecules within reaction chamber 20 are those comprising the partial pressure of the nitrogen-containing gas. The nitridation plasma is comprised of electronically-excited atoms and molecules, ions, neutral radicals and electrons. An example of excitation power source 28 is a radio-frequency power source operating with a frequency between 0.1 MHz and 20 MHz, preferably about 13.6 MHz, an electric power between 0.1 kW and 1 kW, preferably about 0.5 kW, and a voltage between 3 kV and 8 kV, preferably about 6 kV. Alternatively, the nitridation plasma may be generated by other methods of plasma production familiar to one of ordinary skill in the art, such as arc discharge.

Direct current power supply 30 applies an anodizing bias voltage to the silicon monocrystalline substrates 34 so that they are biased relative to the nitridation plasma. Typically, the anodizing bias voltage serves two functions. First, the bias preferentially attracts nitrogenous ions in the plasma to the monocrystalline silicon substrates 341 providing a continuous source of reactants. Second, the bias can enhance the normally diffusion-limited growth rate of the nitrided layer. Diffusion-limited growth can produce an optimal thickness of tunnel insulator at a suitable temperature with little or no bias. A suitable bias voltage ranges between about 0 V to about 250 V, preferably about 0 V.

Figure 2:
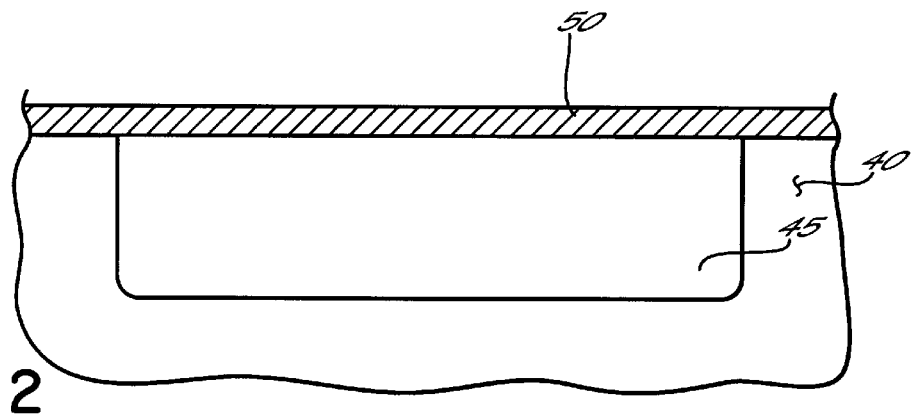
FIG. 2 is a vertical cross-sectional view of a bipolar junction transistor fabricated conventionally up to the step of depositing the polysilicon extrinsic emitter.
Figure 3:
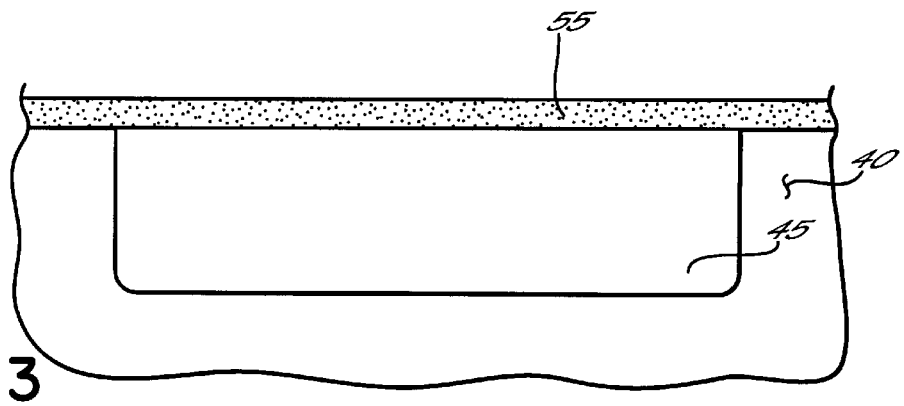
FIG. 3 is a vertical cross-sectional view of the bipolar junction transistor of FIG. 2 following in-situ removal of the oxide layer and nitridation according to one embodiment of the present invention.
Figure 4:
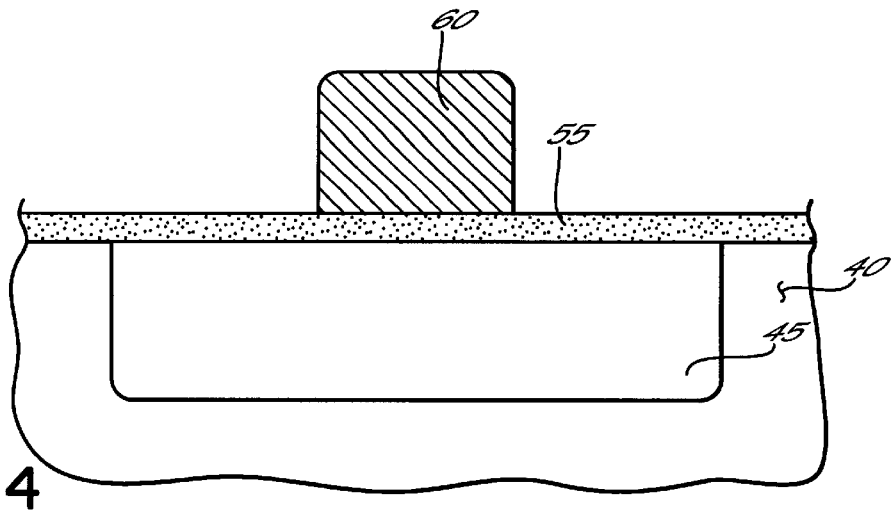
FIG. 4 is a vertical cross-sectional view of the bipolar junction transistor of FIG. 3 following deposition of the polysilicon extrinsic emitter region.

Referring to FIGS. 2 to 4, fabrication steps are schematically depicted for partially forming the emitter region of a vertical bipolar junction transistor according to an embodiment of the method of this invention.

In FIG. 2, a monocrystalline silicon substrate 40 is fragmentarily depicted in a fabrication process for a vertical bipolar junction transistor just prior to deposition of the layer of polysilicon layer. A base region 45 and other device features not shown have been fabricated in the monocrystalline silicon substrate 40 by familiar methods well known in the art.

Unless suitable precautions have been taken, the surface of the monocrystalline silicon substrate 40 is covered by a layer of native oxide 50 with a nominal stoichiometry of $SiO_2$. The layer of native oxide 50 grows naturally and spontaneously on the surface of the monocrystalline silicon substrate 40 as a result of exposure to the oxygen content of the ambient atmosphere. Although the thickness increases with increasing exposure time up to a diffusion-limited maximum, a nominal thickness found on a monocrystalline silicon substrate 40 ranges from 1 nm to 5 nm.

In one embodiment of the present invention, the layer of native oxide 50 is removed prior to plasma-assisted thermal nitridation. Referring to FIG. 1, the monocrystalline silicon substrate 40 having a layer of native oxide 50 is among the one or more silicon substrates 34 loaded onto the substrate support structure 32 of the reaction chamber 20. The reaction chamber 20 is evacuated to a vacuum pressure less than about 10 millitorr, preferably about 0.01 millitorr, using the vacuum pumping system 22. When the desired vacuum pressure is attained, vacuum valve 24 is closed to isolate the reaction chamber 20 from the vacuum pumping system 22.

Hydrogen gas is introduced through the gas inlet 26 by opening gas inlet valve 37 until the vacuum pressure within the reaction chamber 20 reaches about 0.1 to 10 torr, preferably about 1 torr. When the excitation power source 28 is energized, a plasma containing hydrogen ions is generated from the partial pressure of hydrogen. In a method well-known in the art, the monocrystalline silicon substrate 40 is heated to a relatively low temperature to promote a chemical reaction between the native oxide 50 and hydrogen ions in the plasma. A suitable reaction temperature for the monocrystalline silicon substrate 40 is about 200° C. After a reaction time between about 2 to about 5 minutes, the layer of native oxide 50 will be removed from the surface of the monocrystalline silicon substrate 40.

Once the layer of native oxide 50 is removed, the unburdened surface of the silicon monocrystalline substrate 40 is ready for plasma-assisted thermal nitridation. Preparatory to plasma-assisted thermal nitridation, reaction chamber 20 is again evacuated using the vacuum pumping system 22 to a vacuum pressure less than 10 millitorr, preferably about 0.01 millitorr. Once the desired vacuum pressure is attained, the reaction chamber 20 is again isolated from the vacuum pumping system 22 by closing vacuum valve 24. A partial pressure of the nitrogen-containing gas is supplied introduced into the reaction chamber 20 via inlet 26 and gas inlet valve 37 from gas source 36. After adding the partial pressure of nitrogen-containing gas, the total vacuum pressure within the reaction chamber 20 ranges between about 0.01 to 10 torr, preferably about 1 torr.

The nitrogen-containing gas is converted into a plasma by energizing the excitation power source 28. Nitrogenous ions and radicals furnish nitrogen atoms that chemically react with silicon atoms residing at the surface of the monocrystalline silicon substrate 40 to form a layer of silicon nitride 55. Bombardment by energetic ions, radicals, and electrons from the nitridation plasma heats the monocrystalline silicon substrate 40. Alternatively, the heating may be supplemented by an external source such as a resistive heater.

If the plasma-assisted thermal nitridation is diffusion-limited, the nitridation temperature of the monocrystalline silicon substrate 40 ranges between about 150° C. and about 1100° C., preferably between about 150° C. and 250° C., and the nitridation time ranges between about 1 minute to about 10 minutes, preferably between about 4 to about 6 minutes. In the diffusion-limited growth regime, the growth rate of the layer of silicon nitride 55 is inversely proportional to the layer thickness. A suitable thickness for the layer of silicon nitride 55 is less than about 4 nm, preferably about 1 nm to about 3 nm.

In the diffusion-limited growth regime for plasma-enhanced thermal nitridation, the thickness of the layer of silicon nitride 55 is determined primarily by the nitridation temperature of the monocrystalline silicon substrate 40. If the anodizing bias voltage is applied to enhance the diffusion-limited growth rate, the thickness of the layer of silicon nitride 55 must then be controlled by limiting the nitridation time. Under those conditions, continued exposure to the nitrogenous plasma grows an ever-thickening layer of silicon nitride 55 on the surface of the monocrystalline silicon substrate 40. The nitridation temperature is a function of the mass and heat capacity of the substrate support structure 32 and the electric power supplied by the excitation power source 28. At a given nitridation temperature, partial pressure of nitrogen-containing gas, and anodizing bias voltage, a typical growth rate for the layer of silicon nitride 55 is on the order of 0.05 to 2 nm per minute for usual growth conditions.

A schedule of layer thickness and/or current gain can be empirically determined as a function of nitridation time, nitridation temperature, partial pressure of nitrogen-rich gas, and anodizing bias voltage. The specific schedule will depend upon the idiosyncratic characteristics of the reaction chamber 20. Using the empirical schedule, a predetermined thickness of the layer of silicon nitride 55 to yield a given current gain can be reproducibly formed upon the surface of the monocrystalline silicon substrate 40. An example of such an empirical schedule of layer thickness versus nitridation time is described in "Growth Mechanism of Silicon Plasma Anodic Nitridation," M. Hirayama, T. Matsukawa, H. Arima, Y. Ohno and H. Nakata, J. Electrochem. Soc.: Solid-State Science and Technology, 132, 2492 (1985), which is hereby incorporated by reference.

In another aspect of the present invention, a mixture of hydrogen and nitrogen can be used as a source gas for the nitridation plasma so that the growth of the layer of silicon nitride 55 and the removal of the layer of native oxide 50 occur concurrently. In this aspect, a separate processing step involving a hydrogen plasma is not needed to remove the layer of native oxide 50 before plasma-assisted thermal nitridation.

FIG. 3 fragmentarily shows the monocrystalline silicon substrate 40 of FIG. 2 having the layer of native oxide 50 removed and a layer of silicon nitride 55 formed thereupon. The layer of silicon nitride 55 functions as the tunnel insulator for the vertical bipolar junction transistor. One skilled in the art will recognize that the layer of silicon nitride 55 is a functional electrical equivalent of, or electrically superior to, the layer of native oxide 50. After the monocrystalline silicon substrate 40 is removed from the reaction chamber 20, the layer of silicon nitride 55 serves as a diffusion barrier to oxygen-laden species from surrounding air. Oxygen, water vapor, and other oxygen-containing gas molecules cannot reach the interface between the layer of silicon nitride 55 and the surface of the monocrystalline silicon substrate 40 and chemically react to grow an additional subsurface layer of interfacial oxide. As a result, the thickness of the tunnel insulator of the present invention is temporally stable. In effect, the layer of silicon nitride 55 passivates the underlying monocrystalline silicon substrate 40.

Referring to FIG. 4, the monocrystalline silicon substrate 40 of FIG. 3 is fragmentarily depicted having a patterned layer of polysilicon 60 deposited over the layer of silicon nitride 55. After the monocrystalline silicon substrate 40 is removed from the reaction chamber 20, a layer of polysilicon 60 is deposited by a process well known in the art, such as chemical vapor deposition. A typical thickness for the polysilicon extrinsic emitter ranges between about 50 nm to 500 nm, preferably about 250 nm. Following this processing step, the layer of silicon nitride 55 is sandwiched between the transistor base 45 and the extrinsic emitter formed by the patterned layer of polysilicon 60.

After the extrinsic emitter region is formed on the substrate, subsequent processing steps complete the fabrication of the transistor and other semiconductor devices on the surface of the monocrystalline silicon substrate 40. For example, the layer of polysilicon 60 is typically doped with a concentration profile of a suitable impurity donor or acceptor atom by a process well known in the art. A heat treatment, by another method well known in the art, may be performed to thermally diffuse the impurity species throughout the layer of polysilicon 60. As a diffusion barrier, the layer of silicon nitride 55 prevents impurity diffusion from the layer of polysilicon 60 into the underlying monocrystalline silicon substrate 40, creating a near ideal abrupt emitter-base junction fixed at the interface with the layer of silicon nitride 55. Such well known device fabrication steps are not detailed herein and form no part of the present invention.

Figure 5:
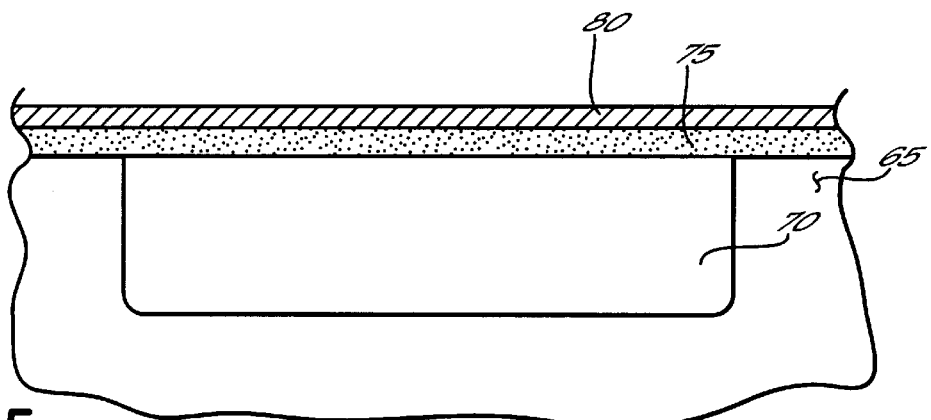
FIG. 5 is a vertical cross-sectional view of the bipolar junction transistor of FIG. 2 following nitridation without first removing the layer of native oxide.

FIG. 5 fragmentarily shows a monocrystalline silicon substrate 65, similar to monocrystalline silicon substrate 40 of FIG. 2, having a base 70 covered by a layer of silicon nitride 75 grown thereon by nitridation and a layer of native oxide 80. In this alternative embodiment, however, the layer of native oxide 80 is not removed by an initial heated exposure to a partial pressure of hydrogen in the reaction chamber 20. Instead, the layer of native oxide 80 is left intact prior to plasma-assisted thermal nitridation. Nitrogeneous reactants from the plasma, whether or not aided by the anodizing bias voltage, can readily diffuse through the layer of native oxide 80 to reach the surface of the monocrystalline silicon substrate 65 and react with silicon atoms to form a subsurface layer of silicon nitride 75.

The mixed nitride/oxide thin film may or may not comprise a silicon oxynitride ($SiO_xN_y$). In one aspect, the composite structure may simply be a bilayer having native oxide 80 overburdening silicon nitride 75 or another configuration. Regardless of the specific arrangement, any remaining layer of native oxide 80 at the surface may be removed following nitridation by immersing the substrate in an aqueous solution containing hydrofluoric acid (HF). A typical dilution for the aqueous solution is about 10:1 HF to $H_2O$. A room temperature immersion of about 1 to 3 minutes, preferably about 2 minutes, will remove any residual oxide.

Figure 6:
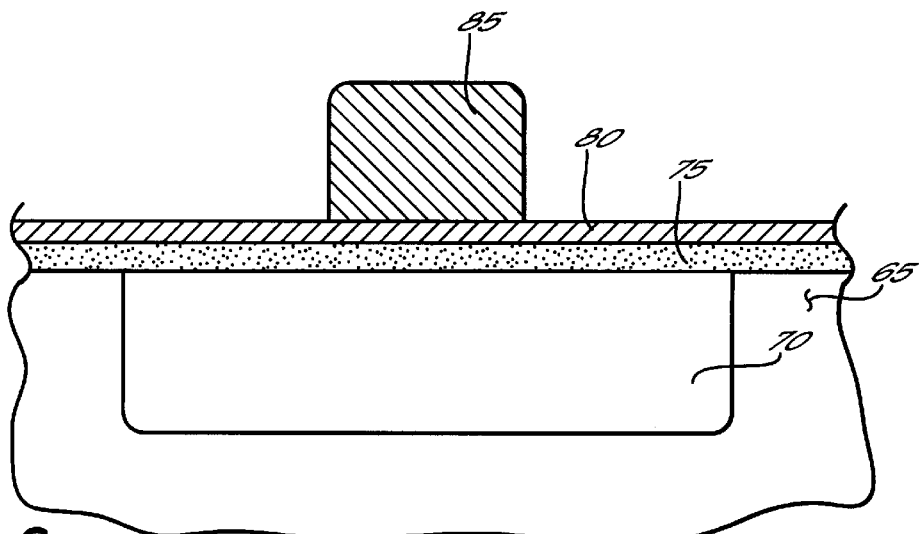
FIG. 6. is a vertical cross-sectional view of the bipolar junction transistor of FIG. 5 following deposition of the polysilicon extrinsic emitter region.

FIG. 6 fragmentarily illustrates a variation of the alternative embodiment of the present method in which the layers of silicon nitride 75 and native oxide 80 have a patterned layer of polysilicon 85 deposited thereon. After nitridizing the monocrystalline silicon substrate 70, a layer of polysilicon 85 is deposited by a method well known in the art without first removing the mixed nitride/oxide layer 75, 80

An interfacial tunnel insulator composed of the mixed nitride/oxide layer 75, 80 is expected to have adequate electrical characteristics, similar to those of silicon nitride, suitable to enhance the current gain of the transistor. In addition, the thickness of the layer of native oxide 80 that may remain is stable since the intervening layer of silicon nitride 75 presents a diffusion barrier for silicon atoms that effectively isolates the underlying monocrystalline silicon substrate 65. In an alternative aspect, if the layer of native oxide 80 is removed by etching in an HF solution subsequent to nitridation and prior to deposition of the polysilicon extrinsic emitter, the structure shown in FIG. 4 will result.

In alternative embodiments of the present invention, the layer of silicon nitride can be thermally grown without the aid of a plasma. A furnace, a rapid thermal processor, or other suitable vessel filled with a nitrogen-containing gas can substitute for reaction chamber 20 shown in FIG. 1 and function as a suitable reaction chamber for performing a thermal nitridation. In these embodiments of the present method, a monocrystalline silicon substrate (similar to monocrystalline silicon substrate 40 and monocrystalline silicon substrate 65) must be heated to a higher nitridation temperature than when treated by plasma-assisted thermal nitridation. As the nitridation temperature is raised, impurity atoms become more mobile in silicon and dopant depth profiles in the monocrystalline silicon substrate may be undesirably altered. To minimize dopant diffusion, the rapid heating and cooling provided by rapid thermal processing may be advantageous when compared to conventional heating in a furnace or other suitable vessel.

In each of these alternative embodiments, the monocrystalline silicon substrate is heated at a sufficient temperature and for a sufficient time to grow the predetermined thickness of silicon nitride. For thermal nitridation in a furnace, a typical nitridation temperature ranges between about 800° C. to about 1300° C., preferably 900° C. to 1200° C., and a typical nitridation time ranges from about 5 minutes to about 60 minutes, preferably less than about 15 minutes. For thermal nitridation in a rapid thermal processor, a typical nitridation temperature ranges from between 400° C. to about 1200° C., preferably 850° C. to 1050° C., and a typical nitridation time ranges from about 5 seconds to about 120 seconds, preferably less than about 30 seconds. Preferred nitrogen-containing gases for thermal nitridation include nitrogen ($N_2$), ammonia ($NH_3$), a mixture of nitrogen and ammonia, and a mixture of nitrogen and hydrogen ($N_2/H_2$). A suitable partial pressure for the nitrogen-containing gas within the reaction chamber ranges from about 0.01 torr to about 10 torr.

Those of ordinary skill in the art of device fabrication will recognize that the layer of silicon nitride may be deposited, rather grown, by liquid phase chemical vapor deposition, plasma-enhanced chemical vapor deposition, sputter deposition, and other techniques familiar to one of ordinary skill in the art of thin film deposition.

The previously described details, aspects and embodiments of the present invention present many advantages, including enhancing the gain of a transistor by introducing a tunnel insulator and providing a diffusion barrier to oxygen-containing molecules so that the tunnel thickness will remain temporally stable.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details and representative methods shown and described. Accordingly, departures may be made from such details without departing from the spirit or scope of applicant's general inventive concept.

What is claimed is:

1. A method of forming the extrinsic emitter of a bipolar junction transistor on a surface of a monocrystalline silicon substrate, said transistor having a predetermined current gain and said surface of the monocrystalline silicon substrate having a layer of oxide thereon, the method comprising the steps of:

determining a predetermined thickness of an interfacial layer of silicon nitride necessary to provide the predetermined current gain according to a schedule correlating current gain with the thickness of the interfacial layer of silicon nitride, wherein the predetermined thickness is less than or equal to about 4 nanometers;

forming the interfacial layer of silicon nitride having the predetermined thickness on the monocrystalline silicon substrate, and depositing a layer of polycrystalline silicon over the interfacial layer of silicon nitride.

2. The method of claim 1 further comprising, before the step of forming the interfacial layer of silicon nitride, the step of removing the layer of oxide from the surface of the monocrystalline silicon substrate.

3. The method of claim 1, further comprising, after the step of forming the interfacial layer of silicon nitride, the step of removing the layer of oxide from the surface of the monocrystalline silicon substrate.

4. The method of claim 3, wherein the step of removing the layer of oxide comprises immersing the substrate in a solution containing hydrofluoric acid.

5. The method of claim 1, wherein the layer of oxide comprises a layer of native oxide ($SiO_2$).

6. The method of claim 1, wherein the interfacial layer of silicon nitride comprises a layer of stoichiometric silicon nitride ($Si_3N_4$).

7. The method of claim 1, wherein the predetermined thickness of the interfacial layer of silicon nitride is between about 1 nanometer and about 3 nanometers.

8. The method of claim 1, wherein the step of forming the interfacial layer of silicon nitride further comprises the substeps of:

heating the monocrystalline silicon substrate to a nitridation temperature sufficient to grow silicon nitride, and exposing the heated monocrystalline silicon substrate to a plasma having nitrogen ions for a nitridation time sufficient to grow the predetermined thickness of the interfacial layer of silicon nitride.

9. The method of claim 8, wherein the nitridation temperature of the monocrystalline silicon substrate ranges from about 150° C. to about 1100° C. and the nitridation time ranges from about 1 minute to about 10 minutes.

10. The method of claim 8, wherein the step of exposing further comprises the substeps of:

providing a reaction chamber, placing the monocrystalline silicon substrate in the reaction chamber, evacuating the reaction chamber to a subatmospheric pressure, introducing a partial pressure of a nitrogen-containing source gas into the reaction chamber, and generating a plasma from the partial pressure of the nitrogen-containing source gas.

11. The method of claim 10, further comprising before the step of generating the plasma, the step of applying a direct current voltage to the monocrystalline silicon substrate.

12. The method of claim 10, wherein the nitrogen-containing gas is a gas selected from the group consisting of nitrogen, ammonia, a mixture of nitrogen and ammonia, and a mixture of nitrogen and hydrogen.

13. The method of claim 10, further comprising before the step of generating the plasma and after the step of evacuating, the step of removing the layer of oxide from the surface of the monocrystalline silicon substrate.

14. The method of claim 13, wherein the step of removing the oxide layer comprises the steps of:

introducing a partial pressure of a hydrogen source gas into the reaction chamber, generating a plasma having hydrogen ions from the partial pressure of hydrogen source gas in the reaction chamber, and heating the monocrystalline silicon substrate exposed to the plasma for a reaction time sufficient and at a reaction temperature sufficient to remove the layer of oxide.

15. The method of claim 14, wherein the reaction temperature is about 200° C. and the reaction time ranges from about 2 minutes to about 5 minutes.

16. The method of claim 1, wherein the step of forming the interfacial layer of silicon nitride comprises heating the monocrystalline silicon substrate in a furnace having a nitrogen-containing atmosphere for a sufficient time and at a sufficient temperature to grow the predetermined thickness of silicon nitride.

17. The method of claim 16, wherein the temperature of the monocrystalline silicon substrate ranges from about 800° C. to about 1300° C. and the time ranges from about 5 minutes to about 60 minutes.

18. The method of claim 16, wherein the nitrogen-containing gas is a gas selected from the group consisting of nitrogen, ammonia, a mixture of nitrogen and ammonia, and a mixture of nitrogen and hydrogen.

19. The method of claim 1, wherein the step of forming the interfacial silicon nitride layer by nitridation comprises heating the monocrystalline silicon substrate in a rapid thermal processor having a nitrogen-containing atmosphere for a sufficient time and at a sufficient temperature to grow the predetermined thickness of silicon nitride.

20. The method of claim 19, wherein the temperature of the monocrystalline silicon substrate ranges from about 400° C. to about 1200° C. and the time ranges from about 5 seconds to about 120 seconds.

21. The method of claim 19, wherein the nitrogen-containing gas is a gas selected from the group consisting of nitrogen, ammonia, a mixture of nitrogen and ammonia, and a mixture of nitrogen and hydrogen.

* * * * *